United States Patent [19]

Saper et al.

[11] 3,946,310
[45] Mar. 23, 1976

[54] LOGIC TEST UNIT

[75] Inventors: Barry M. Saper, Los Altos; Tim Yee Lam, Sunnyvale, both of Calif.

[73] Assignee: Fluke Trendar Corporation, Mountain View, Calif.

[22] Filed: Oct. 3, 1974

[21] Appl. No.: 511,548

[52] U.S. Cl. ............................ 324/72.5; 324/73 PC
[51] Int. Cl.² .......................................... G01R 15/12
[58] Field of Search ................ 324/72.5, 158 F, 73; 339/17 CF, 108 TP; 317/101

[56] References Cited
UNITED STATES PATENTS

| | | | |
|---|---|---|---|
| 3,286,175 | 11/1966 | Gerbier et al. | 324/73 R |
| 3,667,037 | 5/1972 | Kierce | 324/73 R |
| 3,670,245 | 6/1972 | Gordon | 324/73 R |
| 3,699,501 | 10/1972 | Enright et al. | 324/72.5 |
| 3,821,645 | 6/1974 | Vinsani | 324/73 R |

OTHER PUBLICATIONS

"New Product Applications," IEEE Spectrum, Mar. 1971, p. 87.

*Primary Examiner*—John K. Corbin
*Assistant Examiner*—R. Hille
*Attorney, Agent, or Firm*—Townsend and Townsend

[57] ABSTRACT

A device for testing the logic states of integrated circuits while operating in-circuit. The device includes a hand-held housing containing a pair of spaced circuit boards to which a clip is electrically coupled, the clip having terminals for making electrical contact with the pins on a test IC. The device has a circuit programmed for a particular IC by a socket having removable pins of different lengths. The socket has means for receiving a reference IC against which the test IC is to be compared. Switch means coupled with the circuit permit individual testing of the pins of the test IC.

12 Claims, 7 Drawing Figures

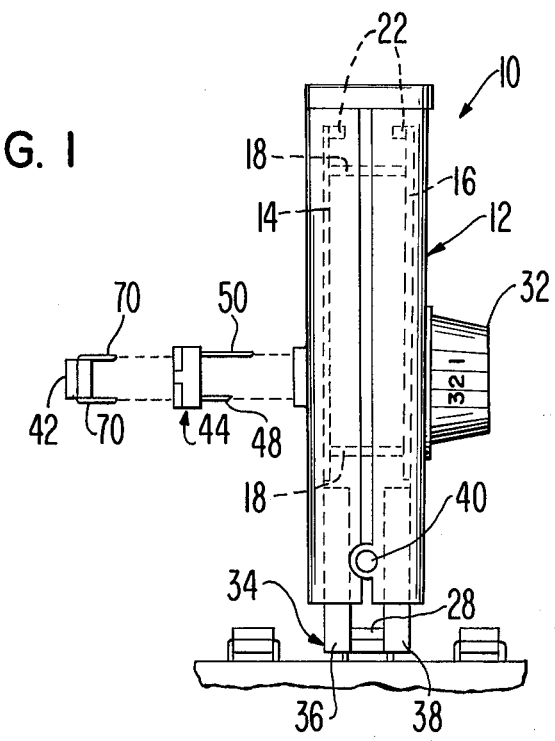
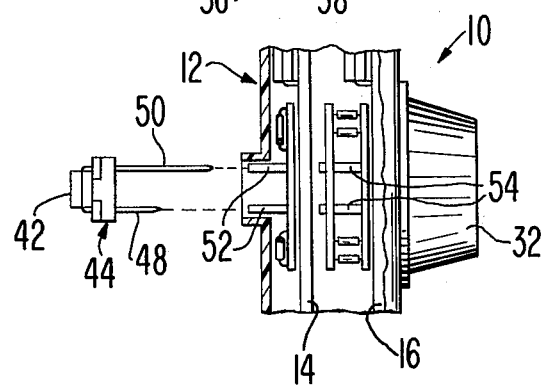
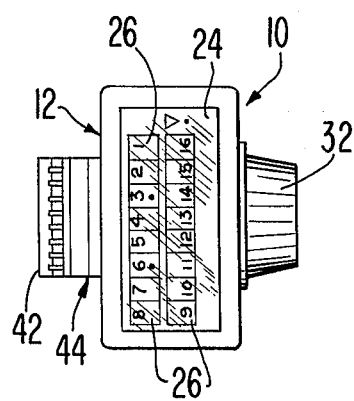
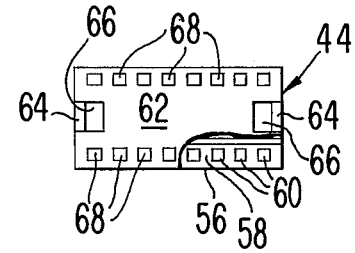
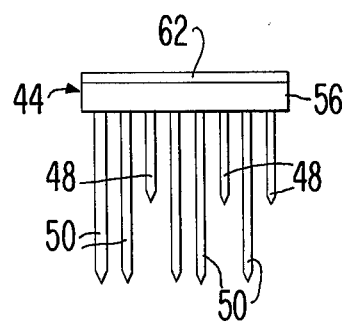
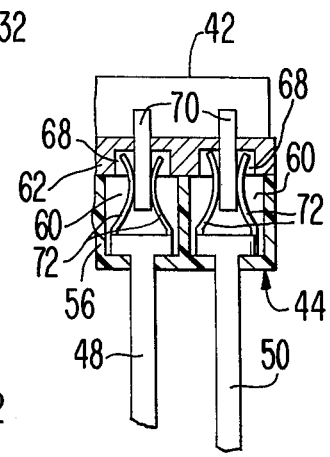

LOGIC TEST UNIT

This invention relates to improvements in the testing of operating states of logic elements and, more particularly, to a simple, easy to handle logic test unit which can be quickly programmed to test a particular integrated circuit.

BACKGROUND OF THE INVENTION

In the construction of printed circuit boards and other circuitry involving digital integrated circuits (hereinafter referred to as ICs) many manufacturing defects will occur due to poor connections, bad soldering techniques and the like. These defects must be located and corrected before the products are shipped to customers and the process of testing the same requires fast testing techniques as well as equipment that is simple to use and of a size permitting mobility even in limited spaces. The prior logic test units have not met all of the foregoing criteria for one reason or another; therefore, a need has arisen for such a test unit which is simple to use, can be hand-carried, and can operate to test an IC while the same is in-circuit.

SUMMARY OF THE INVENTION

The present invention satisfies the foregoing need by providing an improved logic test unit which can be simply clipped onto an existing, in-circuit IC to test the logic states of its various pins or terminals. Such logic states can be readily and successively indicated by a visual display carried by the unit in a readily observable location. Further, the unit need not carry a power pack inasmuch as its circuit is arranged to draw power from the test IC itself. To this end, the circuit includes an automatic power locator to effect this purpose. Because of this feature, the size and weight of the unit of the present invention can be minimized.

A major function of the unit of this invention is to compare a test IC with a reference IC. Means is provided for coupling the reference IC to the unit, yet such coupling means is constructed so that different ICs can be used as references, depending upon the structure of the IC to be tested. The coupling means associated with the unit of this invention includes a socket having removable pins which can be relatively long or relatively short so that the lengths of the pins will determine the programming of the circuitry of the unit, thereby conditioning the same to test the logic states of a particular IC.

If the reference IC is omitted, the unit of the invention acts to display simultaneously the inverse logic states of the terminals of the test IC if the states change slowly. This additional feature increases the versatility of the unit. Also, logic states of the terminal of an integrated circuit can be monitored.

The primary object of the present invention is to provide an improved logic test unit which can be hand-held and readily clipped onto an integrated circuit to be tested so that the logic states of the IC can be read directly or compared with a reference IC, all of which can be accomplished without the use of movable probes and without disturbing the circuit in which the test component forms a part.

Another object of this invention is to provide a logic test unit of the type described wherein the test unit itself can be quickly and easily programmed to permit comparison between the operating states of an integrated circuit under test and a reference component to thereby minimize testing time yet assure an accurate comparison between the components.

A further object of this invention is to provide a unit of the aforesaid character which is simple and rugged in construction, can be carried in a garment pocket and can be used even by unskilled workers.

Other objects of this invention will become apparent as the following specification progresses, reference being had to the accompanying drawings for an illustration of the invention.

In the drawings:

FIG. 1 is a side elevational view of the test unit of this invention, showing the way in which it is clipped onto a component to be tested;

FIG. 2 is an enlarged, fragmentary, cross-sectional view of the test unit;

FIG. 3 is a top plan view of the unit;

FIG. 4 is a top plan view of the socket used to program the unit;

FIG. 5 is a side elevational view of the socket;

FIG. 6 is an enlarged, fragmentary, cross-sectional view of the socket and reference component associated therewith.

Figure 7:
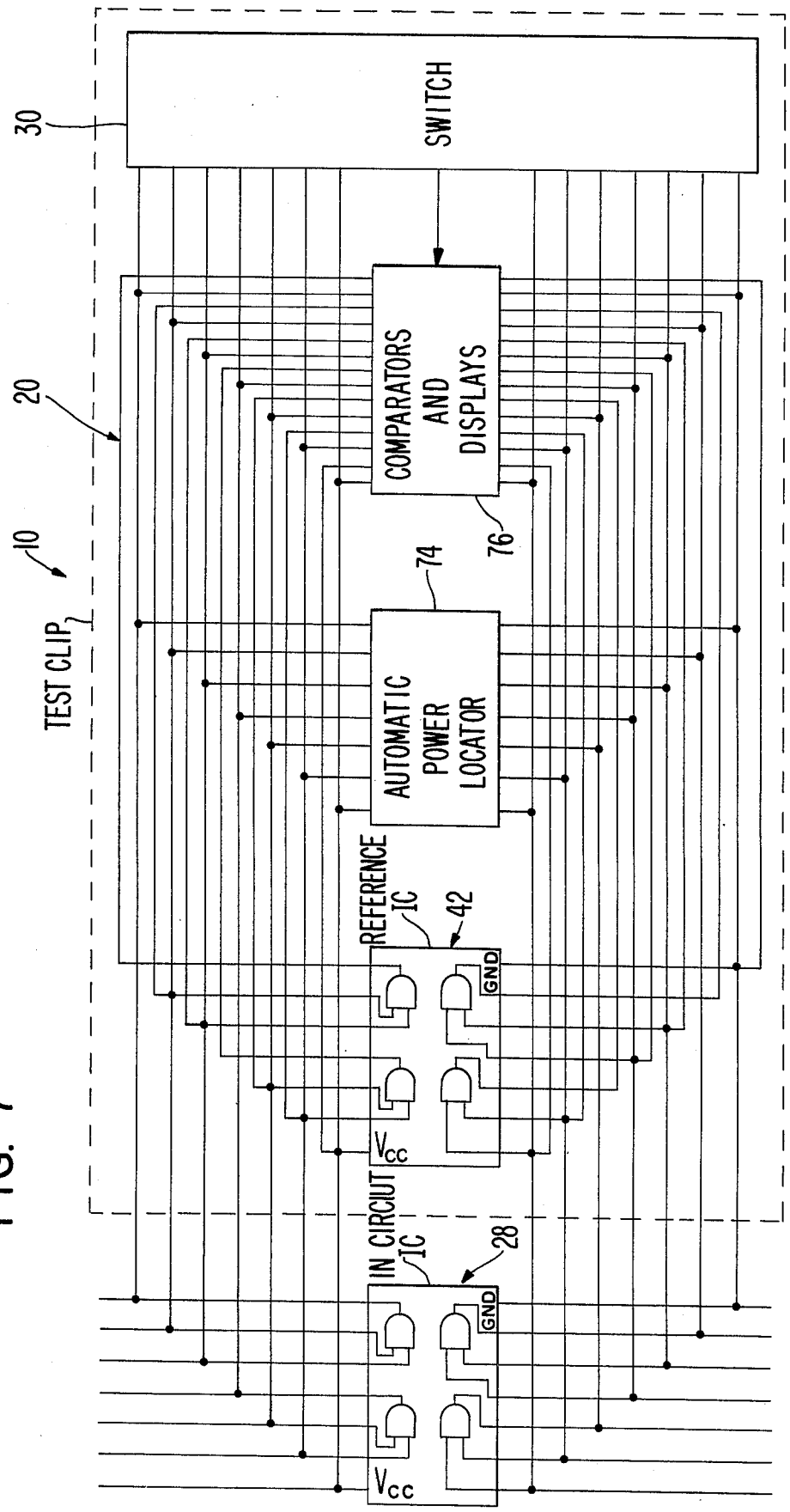
FIG. 7 is a schematic diagram of the circuitry of the unit.

The logic test unit of this invention is broadly denoted by the numeral 10 and includes an outer, elongated housing 12 having a pair of printed circuit boards 14 and 16 thereon, boards 14 and 16 being releasably interconnected by pins 18 and having circuit 20 (FIG. 7) carried thereon. Circuit 20 includes a number of light-emitting diodes 22 adjacent to and below a transparent panel 24 (FIG. 3) at the normally uppermost end of unit 10, panel 24 having individual window squares 26 for viewing respective light-emitting diodes 22 therebelow. Squares 26 are numbered to corespond with pin locations on an integrated circuit 28 (hereinafter referred to as IC).

Circuit 20 further includes switch means 30 (FIG. 7) operated by turning a knob 32 on one side of housing 12, there being a shaft extending through the housing and coupled to the knob, the shaft forming part of switch means 30.

Unit 10 further includes clip means 34 at the normally lowermost end thereof, clip means 34 including a pair of jaws 36 and 38 pivotally interconnected by a pin 40 for rotation about a generally horizontal axis passing parallel to the sidewalls of housing 12. Jaws 36 and 38 have terminals (not shown) thereon which extend upwardly from the lower ends of the jaws. These terminals are adapted to make electrical contact with terminals on IC 28 when the jaws are on opposed sides thereof. A coil spring (not shown) biases the lower ends of jaws 36 and 38 toward each other so that the jaws can clip onto IC 28.

The terminals of jaws 36 and 38 are electrically connected to circuit 20 on boards 14 and 16 in any suitable manner. Thus, by clipping jaws 36 and 38 onto IC 28, IC 28 can be electrically connected to circuit 20 in the manner shown in FIG. 7.

Circuit 20 can be programmed for testing IC 28 by the use of a reference IC 42 which is identical to IC 28 but of known quality. IC 42 is removably coupled to a socket 44 having a plurality of pins for making electrical connection to circuit 20 on boards 14 and 16. As shown in FIG. 5, certain of the pins (denoted by the numerals 48) are shorter than the remaining pins 50. Short pins 48 are adapted to extend into tubular electrical terminals 52 carried by board 14. Pins 48 are not long enough to project laterally from board 14 toward board 16. Pins 50 are long enough to extend through respective tubular terminals 52 on board 14 and also into respective tubular terminals 54 on board 16. Thus, by the judicious selection of the lengths of the pins of socket 44, these pin lengths will be determined by the particular structure of IC 28, one such structure being shown in FIG. 7, it being clear that IC 28 and IC 42 are identical with each other.

Socket 44 includes a base 56 having a pair of opposed sidewalls 58, only one of which is shown in FIG. 4, each wall 58 having a plurality of holes 60 therethrough for receiving pins 48 and 50. After the pins are inserted in holes 60, a cap 62 is placed onto base 56 and held thereto by end spring members 64 integral with base 56 and snapped into recesses 66 in the ends of cap 62. Cap 62 has holes 68 aligned with respective holes 60 so that the electrical terminals or pins 70 of IC 42 can be inserted into holes 68 and thereby into electrical contact with the inner ends of respective pins 48 and 50 in the manner shown in FIG. 6. In this way, electrical contact is made between pins 70 and pins 48 and 50. Moreover, each of pins 48 and 50 has an inner end comprised of a pair of spring elements 72 which receive the corresponding pin 70; thus, IC 42 is releasably coupled to socket 44 and can be removed therefrom by pulling outwardly of the socket.

Circuit 20 includes a logic monitor circuitry, an automatic power locator 74, and a comparator and display sub-circuit 76. The wiring of circuit 20 is as shown in FIG. 7 so that, when unit 10 is coupled to IC 28 under test, IC 28 and IC 42 will be coupled to automatic power locator 74 and sub-circuit 76 as well as switch 30 as shown.

In operation, when arranged as shown in FIG. 1, unit 10 is mechanically and electrically coupled to IC 28. In such a case, the inputs of the various gates of IC 28 are coupled with identical inputs of the gates of IC 42. However, the outputs of IC 28 and IC 42 are not interconnected but go to respective inputs to the comparator of subcircuit 76. Thus, all the corresponding outputs of IC 28 and IC 42 are compared simultaneously. By manipulation of switch means 30, the logic state of a particular pin of IC 28 can be monitored by the use of an LED which shows whether a pin is high or low or is toggling even at high frequency. Switching can continue to check all pins of IC 28.

An indication will occur if IC 28 is defective in any way. For instance, it may not toggle nor follow its truth table if there is a physical fault in the structure of IC 28 such as a solder bridge, broken trace or the like. To test a particular IC, unit 10 need only distinguish between inputs and outputs. Typically, the output pin positions of IC 42 are provided with short pins 48, longer pins 50 representing the input pin positions. Thus, short pins 48 couple the outputs of IC 28 and IC 42 to the comparator so that the latter can check output correspondence between the two.

When it is desired to test another type of IC, socket 44 can be removed from terminals 52 and 54 so that pins 48 and 50 can be interchanged to correspond with the test IC. In the alternative, another pre-programmed socket can be used. In the latter case, a number of pre-programmed sockets will be made available and be ready for use so that any one can be selected and used for a respective IC to be tested.

Unit 10 thus provides a simple, hand-held test device which is small enough so that it can be carried in the pocket. Unit 10 has a number of advantages over the three commonly used logic testing devices which include the logic probe, logic states display clip and a hand-held IC comparator. Among such advantages are the following: unit 10 automatically tests an IC while it is operating in-circuit and at high frequencies; unit 10 automatically locates IC faults and circuit board faults; unit 10 displays logic states, toggling and failures by pin number; unit 10 can handle logic levels in a given range such as from 4.5 volts to 10 volts automatically without adjustment; unit 10 has a high impedance and low capacitance input to insure against erroneous circuit behavior; and unit 10 is programmed with socket means which requires no soldering.

We claim:

1. A logic test unit for testing a circuit component having a number of terminals comprising: means defining an electrical circuit for comparing the logic states of the terminals of a first circuit component with those of a second circuit component, a first portion of said circuit being spaced from a second portion thereof; clip means electrically coupled with said circuit for removably and electrically connecting the latter with the terminals of said first circuit component; and means removably connectable with said circuit for electrically connecting the same to said second circuit component, whereby said logic states of corresponding terminals of said circuit components can be compared with each other, said connecting means having a number of electrical pins, at least one of the pins being electrically engageable only with said first circuit portion, the remaining pins being electrically engageable with said second circuit portion.

2. A logic test unit as set forth in claim 1, wherein is included a pair of spaced circuit boards, said first circuit portion being carried on one of said boards, the second circuit portion being carried on the other board.

3. A logic test unit as set forth in claim 2, wherein said connecting means includes a socket on one side of one of the circuit boards, the other circuit board being adjacent to the opposite side of said one circuit board.

4. A logic test unit as set forth in claim 2, wherein the circuit boards are separable from each other.

5. A logic test unit as set forth in claim 1, wherein said connecting means includes a socket having a plurality of removable pins, at least one of the pins being of a length less than that of the other pins.

6. A logic test unit as set forth in claim 1, wherein said clip means is removable from the circuit boards.

7. A logic test unit as set forth in claim 1, wherein said connecting means includes a socket having a plurality of spaced pins and means for removably mounting the second circuit component thereon with the terminals of said circuit component electrically coupled with respective pins.

8. A logic test unit as set forth in claim 7, wherein said pins are removably mounted on said socket.

9. A logic test unit as set forth in claim 8, wherein is included a pair of spaced circuit boards, the first circuit portion being on one of the boards, the second circuit portion being on the other circuit board, each circuit board having a number of terminals, said socket being removably mounted on one of the circuit boards, one group of pins of the socket having lengths shorter than the remaining pins, said one group of pins being engageable with the terminals of said one circuit board, the remaining pins being engageable with the terminals of the other circuit board.

10. A logic test unit as set forth in claim 1, wherein is included an elongated housing, said clip means being at one end of said housing, said circuit including a visual display adjacent to the opposite end of the housing, said housing having means for observing said display through said opposite end.

11. A logic test unit as set forth in claim 10, wherein said housing has a pair of opposed sides, said connecting means including a socket at one side of the housing, said circuit including operable switch means for selecting the terminals of the first circuit component to be tested, and including a manual actuator member at the opposite side of said housing for operating said switch means.

12. A logic test unit comprising: an elongated housing having a pair of opposed sides and a pair of opposed ends, there being an opening through one side of the housing; a pair of spaced circuit boards in said housing; an electrical circuit defining a comparator, a first portion of the circuit being on one of the boards and a second portion of the circuit being on the other circuit board, said boards having respective terminals aligned with the opening in said one side, said circuit having a visual display at one end of the housing, the latter having a transparent panel at said one end to permit the display to be observed; a clip at the opposite end of the housing, said clip adapted to be removably coupled to a first circuit component having a number of terminals, said clip having a number of electrical conductors for engagement with respective terminals of said first circuit component; and a socket having a plurality of removable pins and means for mounting a second circuit component thereon, said pins being of different lengths and receivable within said opening and into coupled relationship with corresponding terminals of respective circuit boards, whereby only certain of said pins will be coupled to said first circuit portion and the remaining pins will be coupled to the second circuit portion.

* * * * *